United States Patent [19]

Daffara

[11] Patent Number: 5,541,965
[45] Date of Patent: Jul. 30, 1996

[54] CARRIER FREQUENCY SYNCHRONIZATION DEVICE USING TWO DIFFERENT B/W FILTERS

[75] Inventor: Flavio Daffara, Paris, France

[73] Assignee: U.S. Philips Corporation, New York, N.Y.

[21] Appl. No.: 181,262

[22] Filed: Jan. 12, 1994

[30] Foreign Application Priority Data

Jan. 13, 1993 [FR] France ................. 93 00245

[51] Int. Cl.⁶ .............. H03D 3/02; H03D 3/18; H03D 3/24; H04L 7/00
[52] U.S. Cl. .............. 375/326; 375/327; 375/376; 375/365; 329/346
[58] Field of Search ............. 375/326, 373, 375/316, 344, 376, 375, 327, 365; 327/47; 329/307, 346; 455/196.1, 197.1, 265; 331/17; 370/105.4

[56] References Cited

U.S. PATENT DOCUMENTS

| | | | |
|---|---|---|---|
| 3,909,735 | 9/1975 | Anderson et al. | 329/346 |
| 4,215,239 | 7/1980 | Gordy et al. | 375/373 |
| 4,473,805 | 9/1984 | Guhn | 331/1 A |
| 4,539,707 | 9/1985 | Jacobs et al. | 455/265 |
| 4,573,208 | 2/1986 | Jacobs et al. | 455/265 |
| 4,718,116 | 1/1988 | Jacobs et al. | 455/265 |
| 4,855,689 | 8/1989 | Kinkel | 375/344 |
| 5,065,107 | 11/1991 | Kumar et al. | 329/308 |
| 5,425,057 | 6/1995 | Paff | 375/326 |

FOREIGN PATENT DOCUMENTS

| | | | |
|---|---|---|---|
| 60-16731 | 1/1985 | Japan | H03L 7/10 |
| 9216063 | 9/1992 | WIPO | H04J 11/00 |

Primary Examiner—Edward L. Coles, Sr.
Assistant Examiner—Kimberly A. Williams
Attorney, Agent, or Firm—Bernard Franzblau

[57] ABSTRACT

A carrier synchronization device determines and compensates for differences in synchronization between a local carrier and a received modulated signal to be demodulated by the local carder. The device includes an apparatus determining an error signal $\epsilon(t)$ representative of synchronization errors. This error signal may be filtered, with different loop bandwidths, either by a first low-pass filter ($Hf_1$ or by a second low-pass filter ($Hf_2$) in order to generate a control signal $u(t)$ for control of a local oscillator. A lock mode detector compares the control signal with a delayed replica of this control signal and selects one of the filters depending on whether the device operates in the lock-in mode or in the capturing mode. The lock mode detector is programmed to switch automatically from one mode to the other. The device can be used for the synchronization of symbol-block format OFDM signals.

20 Claims, 2 Drawing Sheets

CARRIER FREQUENCY SYNCHRONIZATION DEVICE USING TWO DIFFERENT B/W FILTERS

BACKGROUND OF THE INVENTION

This invention relates to a carrier synchronisation device for determining and compensating for differences in synchronisation between a local carder and a received modulated signal to be demodulated by the local carrier generated by said device, the device comprising:

means for determining an error signal ε(t) representative of a synchronisation error between the received modulated signal and the local carrier, a local oscillator which generates the local carrier under control of a control signal u(t), at least two low-pass filters connected in parallel between said means and the local oscillator, the two filters filtering the error signal and providing different loop bandwidths and a lock mode detector, which supplies a selection signal for selecting one of the filters, the output of the selected filter supplying said control signal u(t).

The invention also relates to the use of this device for the synchronisation of signals transmitted in accordance with an OFDM (Orthogonal Frequency Division Multiplex) standard.

Such a synchronisation device is described, for example, in the JP KOKAI- 60 1673 1. That document describes a circuit formed by a phase-locked loop which determines an error signal representative of a phase error, which error signal can be filtered either by a first filter or by a second filter, which filters have different pass bands, in a manner such that the error signal thus filtered produces a control signal which controls a local oscillator. The signal generated by this local oscillator is combined with the received signal in order to generate the error signal. A discriminator circuit detecting a lock-in mode or a capturing mode determines which of the two filters is to be put into operation.

How the discriminator circuit operates is not revealed. It is apparent only that the device performs a phase detection and that the discriminator circuit selects the mode of operation by a phase-related measurement.

However, there are also situations in which allowance is to be made for frequency differences. On the other hand, the discriminator circuit is fixed and cannot adapt itself automatically to operation in the capturing mode or in the lock-in mode.

A special use of the device is in the reception of signals transmitted in accordance with an orthogonal frequency division multiplex (OFDM) method, transmitted particularly by electromagnetic waves, by cable or by satellite, for example, for use in digital television. For uses such as the transmission of television pictures by OFDM modulation, phase detection is ineffective. Moreover, for large-scale uses the device should be not only robust and accurate but also inexpensive.

The technique of transmitting N orthogonal frequencies by frequency division multiplexing consists of splitting up the information to be transmitted by dividing it over a large number of elementary channels having a low bit rate 1/T, T being the bit period. Thus, a highly selective wide-band channel is converted into a large number of non-selective elementary channels. Since these elementary channels together form a wide-band channel, fading during transmission is unlikely to affect the entire channel simultaneously. This technique also enables intersymbol interference to be reduced.

Each elementary channel has a corresponding frequency, the frequencies as a whole being symmetrical about a carrier frequency. Since the use of selective filters during reception is difficult, it is preferred to allow the spectra to overlap but requirements are imposed on the orthogonality between the frequencies in order to eliminate intersymbol interference at the sampling instants. The complete spectrum of an OFDM signal will resemble a rectangular spectrum.

During reception the received signals should be demodulated and subsequently be decoded in order to recover the original information. For this demodulation a local oscillator is used whose frequency should be locked to the received carrier frequency.

SUMMARY OF THE INVENTION

It is an object of the invention to enable a locally generated carrier to be synchronised with a received modulated signal by means of the carder synchronisation device, synchronisation being effected with loop time constants which are adapted to the modes of operation in an automatically programmable manner.

This object is achieved with a synchronisation device in which, in order to supply the selection signal, the lock mode detector calculates differences between the control signal and at least one replica of said control signal delayed by a programmable delay means, which delay means produce specific delays for each filter, the differences being compared with at least one predetermined threshold by comparison means in order to supply the selection signal which determines the filter to be selected.

Thus, said device advantageously reduces frequency differences between the received modulated signal and the local carrier by the use of a control signal u(t) (filtered error signal) which is proportional to the frequency. The device switches from one filter to the other in an automatically programmable manner.

Preferably, said means for determining an error signal comprise either a frequency detector or a phase detector, which measures the synchronisation error by, respectively, calculating the frequency difference or the phase difference between the received signal and the local carder.

This device is particularly interesting in order to ensure that the reception frequency of a receiver is locked to the transmission frequency. For this purpose it is necessary to switch from a capturing mode to a lock-in mode and vice versa depending on the transmitting conditions obtaining in the transmission channel. To this end the delay means apply a first delay and select a first filter providing a large loop bandwidth, in order to cause said device to operate in the capturing mode, and the delay means apply a second delay smaller than the first delay and select a second filter providing a narrower loop bandwidth, in order to cause said device to operate in the lock-in mode.

The device can be used for the synchronisation of block-format OFDM signals of which at least one block is a repetitive synchronisation block. In a special embodiment of the invention the frequency detector determines the error signal by determining a synchronisation error of the received synchronisation blocks. The first delay and the second delay may then be equal to an integral multiple of the repetition rate of the synchronisation blocks.

This has the advantage that an improved performance of the device in the capturing mode can be obtained.

These and other aspects of the invention will be apparent from and elucidated with the aid of the embodiments described hereinafter.

BRIEF DESCRIPTION OF THE DRAWINGS

The invention will be more fully understood with the aid of the accompanying drawings, which is given by way of non-limitative examples and of which.

DETAILED DESCRIPTION OF PREFERRED EMBODIMENTS OF THE INVENTION

Figure 1:
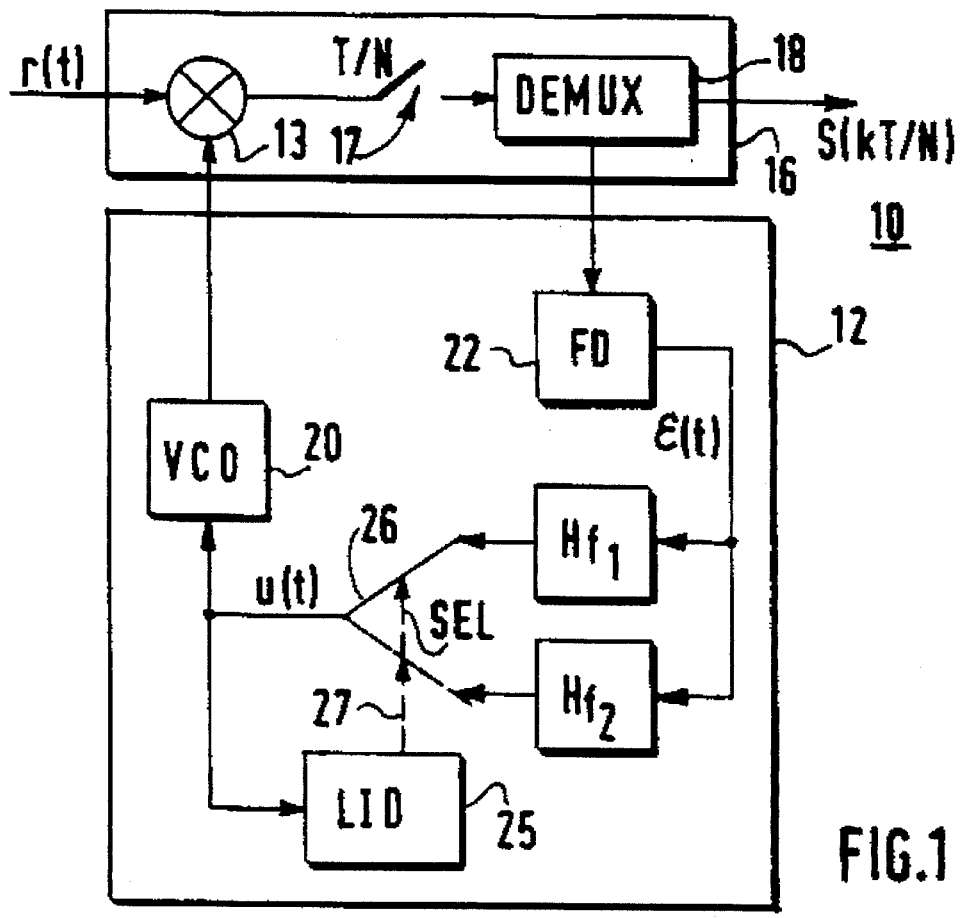
FIG. 1 shows diagrammatically a receiver which comprises a carder synchronisation device in accordance with the invention.

FIG. 1 shows diagrammatically a receiver 10 comprising a demodulator 16 and a carrier frequency synchronisation device 12. A mixer 13 combines the modulated signal r(t) received by the demodulator 16 with a carrier generated locally by a local oscillator, for example, a voltage-controlled oscillator VCO 20. The output of the mixer 13 is a baseband signal, which is applied to a sampler 17 (sampling rate T/N) and a demultiplexer 18, which supplies a demodulated sampled signal s(kT/N). To lock the oscillator frequency to the frequency of the received modulated signal, use is made of the synchronisation device 12, which operates in a loop. For this purpose it receives data from the demultiplexer 18, from which data synchronisation error information is extracted for controlling the carrier frequency generated by the local oscillator 20.

The synchronisation error is determined, for example, by means of a frequency detector FD 22, which determines the frequency difference between r(t) and the local-oscillator frequency and generates an error signal ε(t). A frequency detector 22 suitable for OFDM signals is described in, for example, Patent Application WO 92/16063. The error signal is applied in parallel to two low-pass filters $Hf_1$ and $Hf_2$ whose outputs can be selected to supply a control signal u(t). A lock mode detector LID 25 is used for determining the instant at which it is necessary to switch over from the filter $Hf_1$ (capturing mode) to the filter $Hf_2$ (lock-in mode) and vice versa. The lock mode detector LID 25 effects this change-over by means of a selector 26. The detector 25 employs the control signal u(t) to supply a selection signal SEL 27, which selects one of the filters.

Figure 2:
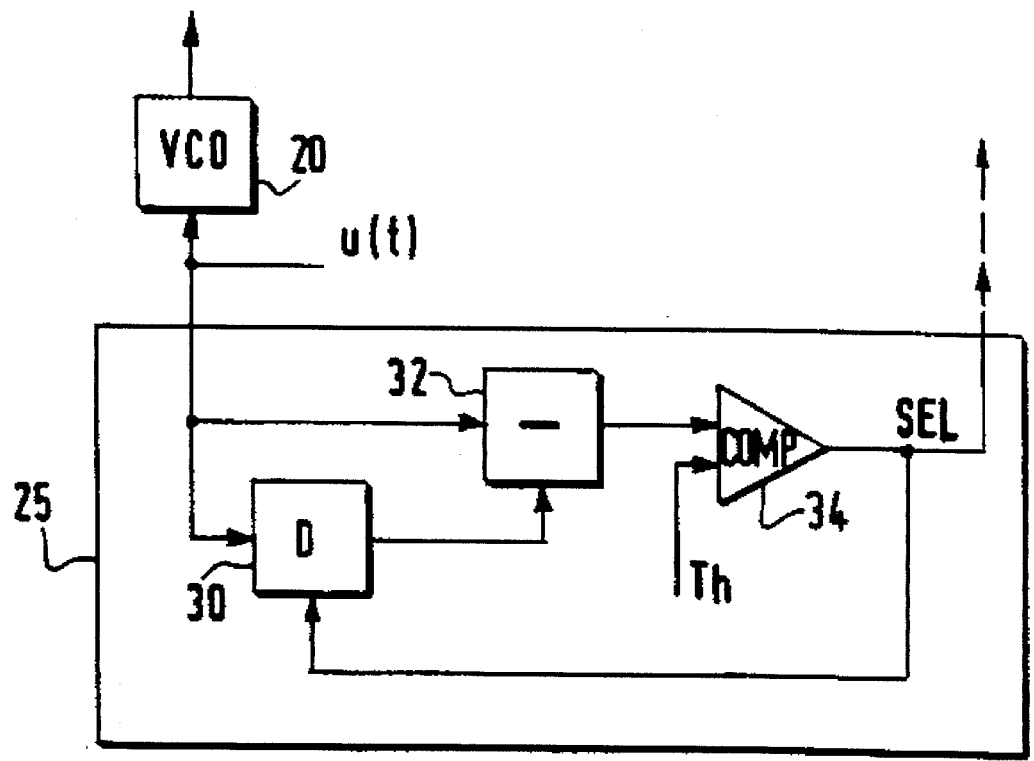
FIG. 2 is a diagram of a detector for detection of the capturing/lock-in mode.

FIG. 2 shows a diagram of the detector 25. It comprises programmable delay means 30, which produce a delay D, and a subtracter 32, which each receive the control signal u(t). The subtracter calculates differences between the control signal u(t) and a replica of the same signal delayed by the means 30. A comparator 34 compares the differences with a threshold Th. The comparator supplies a selection signal SEL, which controls the selector 26 connected to the outputs of the filters. Alternatively, the selector 26 may precede the filters. The selection signal SEL is also applied to the delay means 30 to select a specific delay for each filter and to make the device automatically programmable.

In the lock-in mode the delay D is set to a small value to insure that the synchronisation device responds rapidly to frequency changes. Likewise, the delay D is increased at the beginning of each capturing period in order to mitigate the problem of erroneous locking.

The filter characteristics should be selected so as to obtain an acceptable capture time and a minimal error variance $\sigma^2$ and zero average error under stable frequency conditions. An acceptable capture time is a compromise between a capture time of minimal length and minimal jitter.

The capture time Tacq may be defined as the time necessary to reduce the normalised frequency error to an average value smaller than 0.02. For an OFDM signal it is possible to choose, for example, a filter $Hf_1$ which provides a second-order loop having a normalised pass band $B_f \cdot T_f = 2$ ($T_f$ being the interval between two synchronisation blocks) and an attenuation factor of 20. In the case of additional Gaussian noise this yields a capture time of the order of 15 synchronisation blocks for an initial frequency error of $\Delta f \cdot T_s = 5$ (where $\Delta f = 31.25$ kHz and a symbol length $T_s = 160$ microseconds). At the end of the locking period the frequency stability is determined by the variance of $\Delta f \cdot T_s$. For an S/N ratio= 30 dB this yields $\sigma^2 = 9 \cdot 10^{-5}$ and for S/N= 13 dB this yields $\sigma^2 = 1.5 \cdot 10^{-4}$. However, during the locking period the filter $Hf_1$ alone cannot correctly cope with the problems resulting from jitter and the presence of a residual frequency error which persists for a long time. To reduce the jitter in the lock-in mode the filter is replaced by a second filter $Hf_2$ which provides a loop whose pass band is narrower than that provided by the filter $Hf_1$. The filter $Hf_2$ may provide, for example, a first-order loop such that the normalised bandwidth is $B_f \cdot T_f = 0.25$. At the end of the locking period the filter $Hf_2$ yields a frequency stabilisation having a variance $\sigma^2 = 2 \cdot 10^{-8}$ for S/N= 30 dB and a variance $\sigma^2 = 3 \cdot 10^{-6}$ for S/N= 13 dB.

This shows that the frequency stabilisation in the locking period has improved when the filter $Hf_2$ is used.

The filters $Hf_1$ and $Hf_2$ may be of an analog or of a digital type. It is possible to provide more than two filters.

Figure 3:
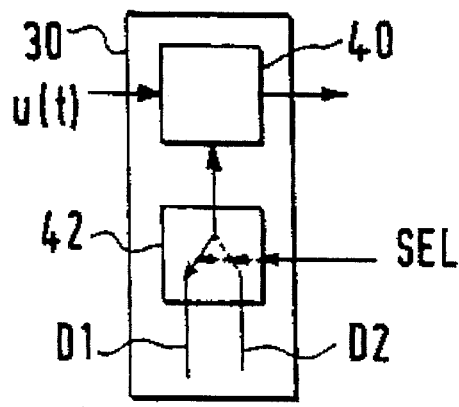
FIG. 3 is a diagram showing an example of the programmable delay means.

FIG. 3 shows a diagram of an example of the delay means 30. The means comprise a delay element 40 such as a shift register (in a digital version) or a delay line (in an analog version). Such delay means are programmed to provide a delay with the aid of a selector 42, which selects either a delay D1 or a delay D2. The selector is controlled by the selection signal SEL.

The delay values D1 and D2 depend on the application for which the synchronisation device is used. In the present example of OFDM, the parameters of the filters $Hf_1$ and $Hf_2$ being as specified above, the delay D has been programmed, for example, to change from 3 Tf to Tf, corresponding to the capturing mode and the lock-in mode, respectively (Tf= one OFDM frame period). A value of 0.8 has been selected for the threshold value Th.

Figure 4A:
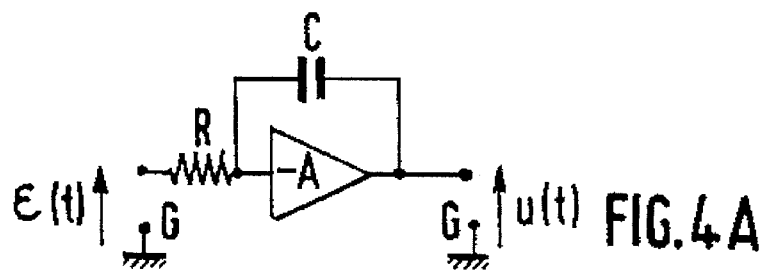
FIGS. 4 and 5 are diagrams of analog and digital low-pass filters, respectively.
Figure 4B:
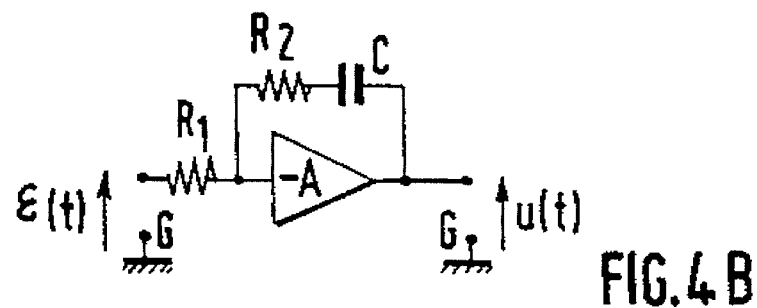

FIG. 4 shows examples of analog filters. In FIG. 4A an amplifier having a gain −A receives the input signal ε(t) via a resistor R. The input of the amplifier is coupled to its output by a feedback capacitance C. The filtered signal u(t) is available relative to ground G on the output of the amplifier. When the synchronisation device 12 (FIG. 1) is used in conjunction with the filter shown in FIG. 4A, the loop will be of the first order. The loop will be of the second order with a filter as shown in FIG. 4B. The difference with respect to FIG. 4A is that a resistor R2 is arranged in series with the capacitance C and that the values of the elements R1 and C are adjusted.

Figure 5A:
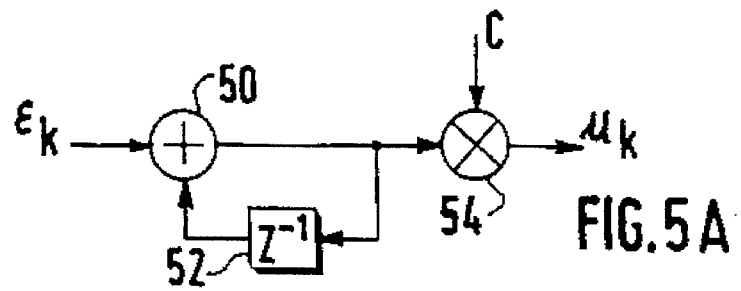
Figure 5B:
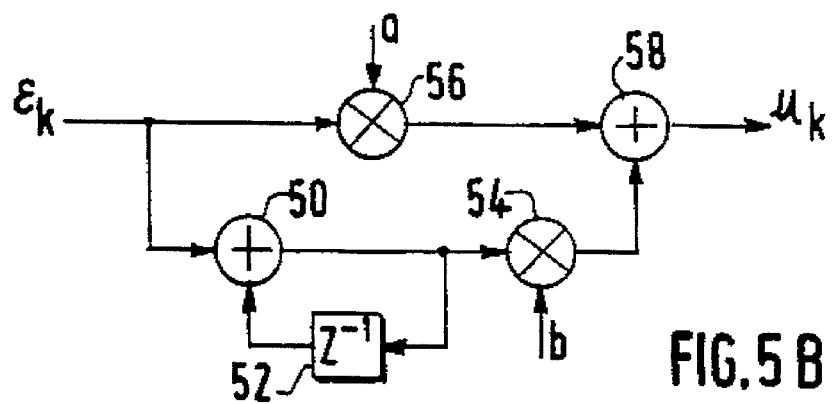

The filters $Hf_1$, $Hf_2$ can be implemented as digital filters. The filters shown in FIGS. 5A and 5B are the digital counterparts of the filters shown in FIGS. 4A and 4B, respectively. In the present case the signals are digitized signals $\epsilon_k$ and $u_k$. A summing element adds the signal $\epsilon_k$ to a delayed replica of the output signal of the summing element, which replica is supplied by the delay means 52. The output of the summing element is also coupled to the input of a multiplier 54, which multiplies the output signal of the summing element by a weighting coefficient c so as to form the filtered signal $u_k$. The filter in FIG. 5A serves to construct a first-order loop.

FIG. 5B shows a filter by means of which a second-order can be obtained. It also comprises a summing element 50, a delay means 52 and a multiplier 54, the elements being arranged in the same way as in FIG. 5A. The multiplier 54 multiplies the output signal of the summing element by a weighting coefficient b. The input of the summing element receives the signal $\epsilon_k$, which is also applied to a multiplier 56 (weighting coefficient a), whose output is connected to a summing element 58, which also receives the output signal of the multiplier 54. The filtered signal $u_k$ is available on the output of the summing element 58.

A filter $Hf_1$ which provides a second-order loop is used in the capturing mode and a filter $Hf_2$ which provides a first-order loop is used in the lock-in mode.

I claim:

1. A carrier synchronisation device for determining and compensating for differences in synchronisation between a local carrier and a received modulated signal to be demodulated by the local carrier generated by said device, the device comprising:

means for determining an error signal $\epsilon(t)$ representative of a synchronisation error between the received modulated signal and the local carrier, a local oscillator which generates the local carrier under control of a control signal u(t), at least first and second low-pass filters ($Hf_1$, $Hf_2$) connected in parallel between said error signal determining means and the local oscillator, the first and second filters filtering the error signal and providing different loop bandwidths, and a lock mode detector which supplies a selection signal (SEL) for selecting one of the filters, the output of the selected filter supplying said control signal u(t), wherein said lock mode detector calculates differences between the control signal and at least one replica of said control signal delayed by a programmable delay means, which delay means produce specific delays for each filter, the differences being compared with at least one predetermined threshold (Th) by comparison means in order to supply the selection signal which determines the filter to be selected.

2. A carrier synchronisation device as claimed in claim 1, wherein said means for determining an error signal comprise either a frequency detector or a phase detector, which determines the synchronisation error by, respectively, calculating the frequency difference or the phase difference between the received signal and the local carrier.

3. A carrier synchronisation device as claimed in claim 2, wherein the delay means produce a first delay whereby the first filter is selected thus providing a large loop bandwidth, thereby to cause said device to operate in the capturing mode, and the delay means produce a second delay smaller than the first delay whereby the second filter is selected thus providing a narrower loop bandwidth, thereby to cause said device to operate in the lock-in mode.

4. A carrier synchronisation device as claimed in claim 3, for the synchronisation of received block-format OFDM signals of which at least one block is a repetitive synchronisation block, when the frequency detector determines the error signal by determining a synchronisation error of the received synchronisation blocks.

5. The use of a carrier synchronisation device as claimed in claim 2, for the synchronisation of received block-format OFDM signals of which at least one block is a repetitive synchronisation block, when the frequency detector determines the error signal by determining a synchronisation error of the received synchronisation blocks.

6. A carrier synchronisation device as claimed in claim 1 wherein the delay means apply a first delay whereby the first filter is selected thus providing a large loop bandwidth, thereby to cause said device to operate in the capturing mode, and the delay means apply a second delay smaller than the first delay whereby the second filter is selected thus providing a narrower loop bandwidth, thereby to cause said device to operate in the lock-in mode.

7. A carrier synchronisation device as claimed in claim 6, for the synchronisation of received block-format OFDM signals of which at least one block is a repetitive synchronisation block, wherein the error signal determining means determines the error signal by determining a synchronisation error of the received synchronisation blocks.

8. A carrier synchronization device as claimed in claim 7, wherein the first delay and the second delay are equal to an integral multiple of the repetition rate of the synchronization blocks.

9. A carrier synchronisation device as claimed in claim 1, for the synchronisation of received block-format OFDM signals of which at least one block is a repetitive synchronisation block, wherein the error Signal determining means determines the error signal by determining a synchronisation error of the received synchronisation blocks.

10. A carrier synchronisation device as claimed in claim 9, wherein the delay means provide a first delay and a second delay with the first delay and the second delay equal to an integral multiple of the repetition rate of the synchronisation blocks.

11. Apparatus for the acquisition and synchronization of a modulated carrier signal comprising:

a frequency controllable oscillator producing a local carrier signal, an input terminal for said modulated carrier signal, means coupled to said input terminal and an output of said oscillator for combining signals received therefrom so as to derive a demodulated signal, means coupled to an output of said signal combining means for deriving at its output an error signal indicative of a synchronization error between the modulated carrier signal and the local carrier signal,.

first and second low-pass filters having different bandwidths and coupled in parallel between the output of the error signal deriving means and a frequency control input of said oscillator via a switching device, said first and second low-pass filters selectively filtering the error signal to supply a control signal to the frequency control input of said oscillator, and a lock mode detector controlled by said control signal for supplying a selection signal for control of the switching device thereby to select one of said filters to supply the control signal to the oscillator and to the lock mode detector, said lock mode detector including means for effectively comparing the control signal with a delayed replica of the control signal so as to derive said selection signal to select a filter dependent on whether the device is operating in a lock-in mode or in an acquisition mode.

12. The apparatus of claim 11 wherein said error signal deriving means determines the synchronization error by determining a frequency difference or a phase difference between the demodulated signal and the local carrier signal.

13. The apparatus of claim 11 wherein the comparing means of the lock mode detector comprises:

a subtraction circuit having one input which receives the control signal, a variable delay device having one input which receives the control signal and an output coupled to a second input of the subtraction circuit, means for comparing an output signal of the subtraction circuit with a threshold signal to derive said selection signal for control of the switching device, and means coupling said selection signal to a control input of the variable delay device.

14. The apparatus of claim 11 wherein the first low-pass filter has a wider pass band than that of the second low-pass filter, and said lock mode detector automatically selects, via the switching device, the first low-pass filter when the apparatus is in the acquisition mode and automatically selects the second low-pass filter, via the switching device, when the apparatus is in the lock-in mode.

15. The apparatus of claim 14 wherein the first filter provides a second order loop and the second filter provides a first order loop.

16. The apparatus of claim 11 wherein the comparing means of the lock mode detector comprises:

an adjustable delay means which produce specific respective delays for each of the first and second low-pass filters, means for determining a difference signal between the control signal and at least one replica of said control signal delayed by the adjustable delay means, and means for comparing the difference signal with a threshold signal thereby to derive the selection signal which determines the filter to be selected.

17. The apparatus of claim 16 wherein the adjustable delay means provide a first delay and the first filter is selected which provides a large loop bandwidth so that the apparatus operates in the acquisition mode, and the adjustable delay means provide a second delay and the second filter is selected which provides a narrower loop bandwidth so that the apparatus operates in the lock-in mode.

18. The apparatus of claim 11 wherein said oscillator comprises a voltage controlled oscillator (VCO) and said signal combining means includes a mixer circuit.

19. The apparatus of claim 11 wherein said input terminal receives block format orthogonal frequency division multiplex (OFDM) signals having at least one repetitive synchronism block and the error signal is derived by determining a synchronization error of the synchronization blocks received at the input terminal.

20. The apparatus of claim 16 wherein said input terminal receives block format orthogonal frequency division multiplex (OFDM) signals having at least one repetitive synchronism block and the error signal is derived by determining a synchronization error of the synchronization blocks received at the input terminal, and the adjustable delay means provide a first delay and a second delay and the first delay and the second delay are equal to an integral multiple of the repetition rate of the synchronization blocks.

* * * * *